(12) United States Patent
Gouk et al.

(10) Patent No.: US 6,954,021 B2
(45) Date of Patent: Oct. 11, 2005

(54) MATCHING CIRCUIT FOR MEGASONIC TRANSDUCER DEVICE

(75) Inventors: Roman Gouk, San Jose, CA (US); Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 156 days.

(21) Appl. No.: 10/194,174

(22) Filed: Jul. 12, 2002

(65) Prior Publication Data

US 2004/0007945 A1 Jan. 15, 2004

(51) Int. Cl.[7] .............................................. H01L 41/09
(52) U.S. Cl. ...................................................... 310/317
(58) Field of Search ........................................ 310/317

(56) References Cited

U.S. PATENT DOCUMENTS

| | | | | |
|---|---|---|---|---|
| 2,426,650 A | * | 9/1947 | Sivian | 228/262 |
| 5,109,174 A | * | 4/1992 | Shewell | 310/317 |
| 5,298,828 A | | 3/1994 | Radovanovich | |
| 5,355,048 A | | 10/1994 | Estes | |
| 5,511,424 A | | 4/1996 | MacLauchlan et al. | |
| 5,625,249 A | | 4/1997 | Grant | |
| 5,631,611 A | | 5/1997 | Luu | |
| 6,188,162 B1 | | 2/2001 | Vennerbeck | |
| 6,212,431 B1 | * | 4/2001 | Hahn et al. | 607/61 |
| 6,222,305 B1 | | 4/2001 | Beck et al. | |
| 6,236,142 B1 | | 5/2001 | Durkee | |
| 6,453,157 B1 | * | 9/2002 | Roberts | 455/337 |

FOREIGN PATENT DOCUMENTS

| | | | | | |
|---|---|---|---|---|---|
| JP | 10-134953 | * | 5/1998 | ............ | H05B/6/48 |
| JP | 10-180202 | * | 7/1998 | ............ | B08B/3/12 |
| JP | 10-180203 | * | 7/1998 | ............ | B08B/3/12 |
| JP | 10-189520 | * | 7/1998 | ......... | H01L/21/304 |
| JP | 10-272429 | * | 10/1998 | ............ | B08B/3/12 |

* cited by examiner

Primary Examiner—Thomas M. Dougherty
(74) Attorney, Agent, or Firm—Blakely Sokoloff Taylor & Zafman

(57) ABSTRACT

A method and apparatus for matching impedance magnitude and impedance phase for an acoustic-wave transducer load and an RF power source. The acoustic-wave transducer load has a load impedance magnitude and phase. The RF power source has a source impedance magnitude and phase. In one embodiment of the invention, a transformer matches the source and load impedance magnitudes. A capacitor, connected in series with the transformer, matches the source impedance phase to the load impedance phase.

13 Claims, 8 Drawing Sheets

SECTION A-A

MATCHING CIRCUIT FOR MEGASONIC TRANSDUCER DEVICE

FIELD

The present invention relates generally to the field of semiconductor technology and, more specifically, to matching circuits for megasonic transducers.

BACKGROUND

In semiconductor wafer substrate (wafer) cleaning, particle removal is essential. Particles can be removed by chemical means or by mechanical means. In the current state of art, one means of removing particles includes the use of a megasonic cleaning device. A megasonic cleaning device utilizes a process wherein a wafer is placed in a liquid bath and high frequency (megasonic) irradiation, or cavitation, is applied to the liquid in the bath. At the same time, chemicals in the liquid provide a slight surface etching and provide the right surface termination, such that once particles are dislodged from the surface by the combination of etch and mechanical action of the megasonics on the particles, these particles are not redeposited on the surface.

Various types of megasonic cleaning devices vary in diverse ways. Some types can clean one wafer at a time. Other types utilize very clever ways to reduce the amount of liquid used in the bath. Yet other types work at some frequencies better than others. Nonetheless, almost all megasonic cleaning devices are similar in at least one way. They all make use of an acoustic-wave transducer.

An acoustic-wave transducer is an electronic device that receives high-frequency power signals (from an RF power source) that excite the transducer and cause it to vibrate. The vibration causes sonic waves to travel through the liquid bath and provide the mechanical means to remove particles from the wafer surface.

For several reasons, however, power signals are not always successfully delivered to the acoustic-wave transducer in the most efficient manner. To properly deliver power to an acoustic-wave transducer, the resistance of the power source must match that of the transducer load. However, for the transducer to function properly, the power signals must be of a sinusoidal nature, such as alternating current (AC). As a consequence of utilizing AC, reactive circuit elements, such as the transmission lines within the megasonic cleaning device, create impedance, and impedance matching is more difficult to accomplish than mere resistance matching.

Some approaches have nonetheless been attempted to match the impedance of an acoustic-wave transducer load to the impedance of an RF power source. One common approach has been to utilize an impedance-matching transformer. A transformer is an electronic device with two wires wound around a magnetic core. The wires wound around the core are called "windings." Typically, the coil connected to the AC power source is called the primary winding, while the coil connected to the load is called the secondary windings. The number of windings in the primary coil compared to the number of windings in the secondary coil is called the "turns ratio." A well known quality of the transformer is that the turns ratio squared is proportional to the impedances of circuits connected to the primary and secondary windings as follows: $(N_P/N_S)^2$; $Z_P/Z_S$, where $N_P$ is the number of primary windings, $N_S$ is the number of secondary windings, $Z_P$ is the impedance seen at the input of the transformer on the primary side and $Z_N$ is the impedance seen at the input of the transformer on the secondary side.

Thus, one approach for matching impedances of transducer loads to that of an RF power source has been to connect the RF power source to the primary windings of a transformer, connect the transducer load to the secondary windings, then to manipulate the turns ratio until the impedances are matched as seen from both sides. This approach, however, has serious detrimental side effects.

For example, the transformer, itself, introduces a good deal of inductance into the circuit, thus increasing the reactance of the circuit. As the reactance goes up, so does the impedance. Impedance is measured in two parts, however, magnitude and phase. Unfortunately, while the transformer works to correct impedance magnitude, it also changes phase. Impedance phase can also affect power loss between the power source and the transducer load. In time, as electronic devices on a silicon wafer decrease in size, so do the particles that need cleaning. As a result, the transducer assembly must create cavitation at higher frequencies. A common way to create higher cavitation frequencies is to use a larger transducer. The larger transducer, however, the lower the impedance it provides, and, as a result, the higher the turns ratio must be in the transformer to match the power source impedance. As the turns ratio increases in the transformer, so does the inductance, and, consequently, so does the phase-difference in the power signals. The more the phase signals get out of phase, the less efficient is the power transfer.

SUMMARY

A matching network circuit for a megasonic transducer is described. In embodiments of the invention described herein, the matching circuit matches both the impedance magnitudes and the impedance phases of an RF power source and an acoustic-wave transducer load. By matching both the impedance magnitude and the impedance phase, the acoustic-wave transducer, on either a single or multiple wafer megasonic cleaning device, can operate at peak power efficiency during operation. Furthermore, the matching circuit can compensate for changes to the transducer load, thus providing optimal power savings over a bandwidth of operating frequencies.

An exemplary matching circuit may include an impedance-phase-matching capacitor, such as a variable capacitor, to adjust phase-differences in AC power signals traveling between the RF power source and the acoustic-wave transducer load, and an impedance-magnitude-matching transformer, such as an autotransformer, to adjust the impedance magnitude of the acoustic-wave transducer load to match the impedance magnitude of the RF power source.

Other features of the present invention will be apparent from the accompanying drawings and from the detailed description that follows.

BRIEF DESCRIPTION OF THE DRAWINGS

The present invention is illustrated by way of example and should not be limited by the figures of the accompanying drawings in which like references indicate similar elements and in which.

DETAILED DESCRIPTION

Figure 1A:
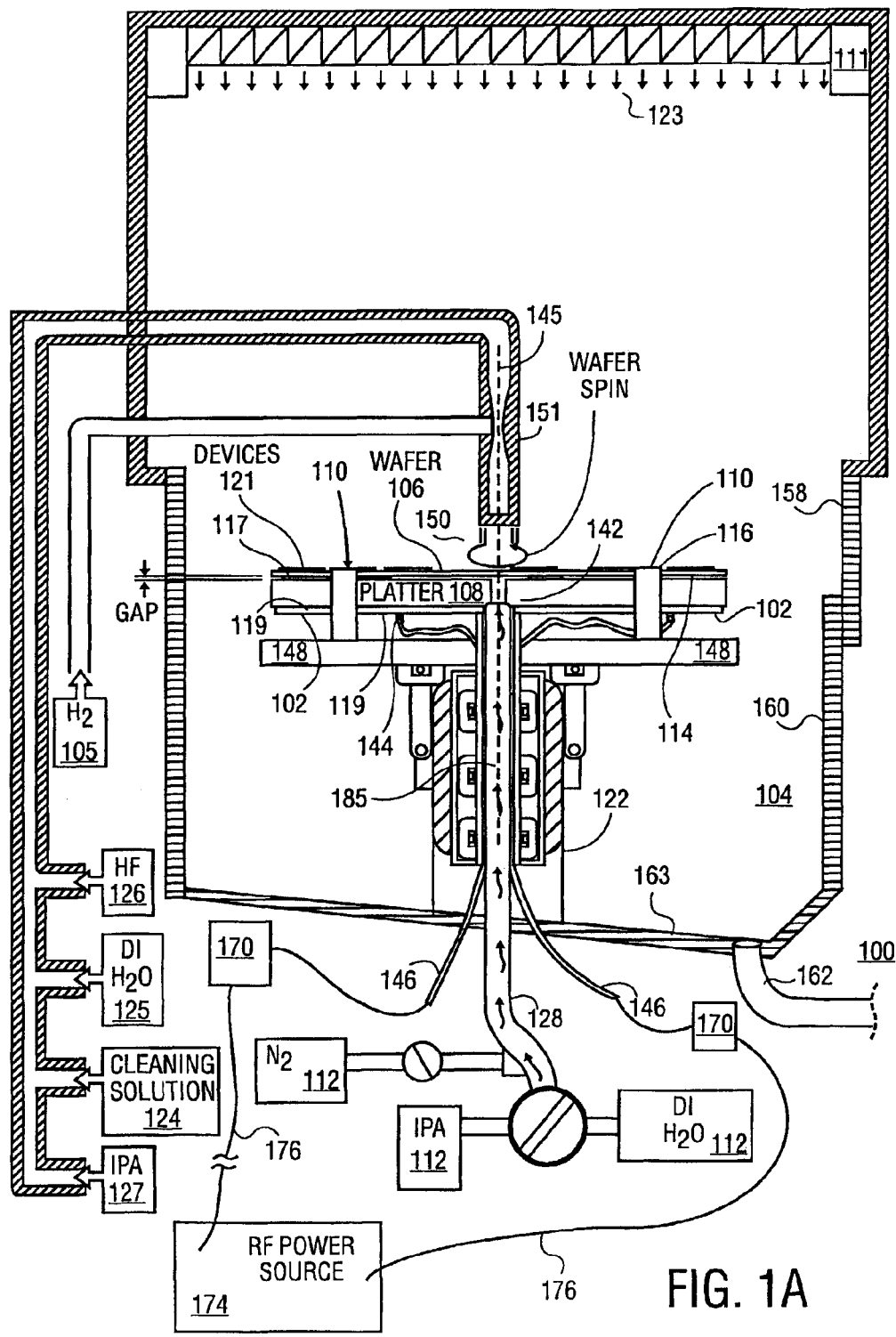
FIGS. 1A–1C illustrates exemplary one-wafer megasonic cleaning device with an exemplary acoustic-wave transducer assembly for cleaning one wafer at a time.

In the following description numerous specific details are set forth. One of ordinary skill in the art, however, will appreciate that these specific details are not necessary to practice embodiments of the invention. While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. In other instances well-known acoustic energy cleaning and/or fabrication processes, techniques, materials, equipment, etc., have not been set forth in particular detail in order to not unnecessarily obscure embodiments of the present invention.

Described herein is a matching circuit for a megasonic transducer utilized in conjunction with a megasonic cleaning device. The megasonic cleaning device includes an acoustic-wave transducer to clean particles from a wafer. The acoustic-wave transducer is to deliver acoustic energy into a cleaning fluid which causes cavitation (bubbling) to occur and gently brush away the particles from the wafer surface. The acoustic-wave transducer receives power signals from an RF power source. The impedance of the acoustic-wave transducer ("load") and the impedance of the RF power source ("source") may require matching. Consequently, the matching circuit, connected between the source and the load, is to match the impedance of the source to that of the load. In embodiments of the invention described herein, the matching circuit matches both the impedance magnitudes and the impedance phases of the source and load. By matching both the impedance magnitude and the impedance phase, a megasonic cleaning device can operate at peak power efficiency during megasonic cleaning, even for a bandwidth of operating frequencies. According to one embodiment of the invention, the matching circuit may include a phase-matching capacitor to adjust impedance phase matching and a magnitude-matching transformer to adjust impedance magnitude matching.

In a megasonic cleaning device, an acoustic-wave transducer is utilized to provide sound wave agitation to a liquid contained within a cleaning chamber. The liquid is typically in the form of a bath, but may also be in the form of a stream or a pulse of liquid. A silicon wafer rests on a platter and is placed in the liquid bath, or in the path of the flowing liquid, and the transducers are activated. When the acoustic-wave transducer is activated, power signals cause a piezoelectric material to become excited and produce sound waves at a certain frequency. When the sound waves encounter the cleaning liquid, they produce pressure oscillations that form bubbles that are continuously expanding and collapsing as a result of the pressure oscillations. This expanding and collapsing of bubbles is known as "cavitation". Many of the bubbles collapse onto the surface of the silicon wafer and brush away loose particles that may reside on the surfaces of the wafer.

The size of the bubbles depends on the frequency at which the piezoelectric crystal vibrates. The lower the frequency, the lower are the pressure oscillations in the liquid, thus allowing the bubbles to be larger. The effect of a large bubble collapsing will produce a more forceful cleaning effect on the wafer surface. A drawback to low frequency cavitation, however, is that the cavitation is more random. As the frequency of the vibration of the transducer increases, however, the greater are the pressure oscillations, and the bubbles are not allowed to get very large. The effect of a small bubble collapsing provides a much more gentle cleansing, and, as a result, can be used for sensitive wafers. Also, if bubbles are smaller, then they can more efficiently clean smaller devices and cavitation can be more controlled.

Currently, cavitation is divided into two viable categories: ultrasonic and megasonic. Ultrasonic frequencies range from approximately between 20–400 kHz. Ultrasonic cleaning is useful for cleaning wafers with large devices and that are less sensitive, since ultrasonic frequencies produce larger cavitation bubbles. Megasonic cleaning uses higher frequencies, beginning at between 350–400 kHz and ranging well into the MHz frequencies. Megasonic frequencies do not cause the more forceful cavitation effects found with ultrasonic frequencies. Megasonic cleaning significantly reduces, or eliminates, cavitation erosion and the likelihood of surface damage to the wafer. Thus, in general, the higher the frequency, the lower the damage to the wafer.

Also, since bubble size is less random for megasonic frequencies, megasonic cleaning produces more controlled cavitation. Controlled cavitation becomes acoustic streaming which can push the particles away so they do not reattach to the wafer. Megasonic cleaning may be improved by varying and/or pulsing the input power to the megasonic transducers, which can provide better control over cavitation than applying power continuously at a constant level. Megasonic cleaning may be improved through the use of a plurality of frequencies to be simultaneously generated, or by changing one or more frequencies during a cleaning cycle, during a rinsing cycles, or any combination thereof. Megasonic cleaning may also be improved through a selection of the frequency or frequencies used. The control of power to the transducers, and through a range of megasonic frequencies, therefore, becomes an important aspect to the performance of a megasonic cleaning device.

FIG. 1A is an illustration of one embodiment of a megasonic cleaning device 100 that cleans one wafer at a time. The megasonic cleaning device is housed within a cleaning chamber 104 characterized by a chamber housing 160. To initiate a wafer process cycle, a rotatable wafer holding bracket 148 translates along an axis 145 a distance upward. A robot arm (not shown) holding a wafer 106 enters the interior of the chamber 104 through an access door 158 and the wafer 106 is placed in the bracket 148. The bracket 148 is then lowered so as to align the wafer 106 horizontally a distance from a circular platter 108. The wafer 106, resting in the bracket 148, is parallel to the platter 108 and located a distance from the platter 108, i.e., the gap. The platter 108 is flat where it faces the wafer 106 and, therefore, the distance separating the platter 108 and wafer 106 is uniform.

Within the cleaning chamber 104, megasonic energy is generated by at least one acoustic-wave transducer ("transducer") 102 attached to the platter 108 and the megasonic energy can pass into the wafer 106 through chemicals 112 in contact with both the wafer 106 and the platter 108. As a result, the wafer 106 can be cleaned with a variety of combinations that include wafer rotation, megasonic energy, and chemical action, all under temperature control. Between and after cleaning and rinsing cycles, the megasonic cleaning device 100 can dry the wafer 106.

The platter 108 has a topside 117 and a bottom side 119, with the at least one transducer 102 positioned in acoustic proximity to the platter. In one embodiment of the invention, as shown in FIG. 1A, the transducer 102 (or transducers) are attached to the bottom side 119 of the platter 108. The platter topside 117 can be facing the wafer 106. In one embodiment, the platter 108 is fixed, but alternate embodiments can have the platter 108 able to translate along the bracket rotation axis 145 to open the gap during wafer rinse or dry cycles. The wafer 106 can be placed in the rotatable wafer holding bracket 148 such that the wafer device side 116 is facing up and away from the platter 108. The wafer 106, when positioned in the bracket 148, can rest on three or more vertical support posts 110 of the bracket 148. When placed in the bracket 148, the wafer 106 can be centered over and held substantially parallel to the platter 108 to create the gap. The gap distance is approximately 3 mm but can fall within the range of approximately 1–5 mm. Gravity and the downward flow of air 123 from a filter 111 can act to maintain the wafer 106 positioned on the posts 110. Positioned beneath the platter 108 can be an electric motor 122 for rotating the bracket 148. A through hole 185 can exist in the electric motor 122 through which is passed the wiring 146 from the platter 108 as well as a tube 128 that can transfer a first set of chemicals 112 ("first chemicals") to a feed port 142. The feed port 142 has an approximate 0.190" diameter. The feed port 142 can be located at the center of the platter 108 or the feed port 142 can be placed off-center by up to a few millimeters (not shown).

Attached to the acoustic-wave transducer 102 can be a copper spring 144. The spring 144 could be of a variety of shapes to maintain electrical contact such as a wire coiled shape (shown) or a flexed foil constructed from sheet metal (not shown). Soldered to the spring's 144 free ends are the wiring's leads, thus forming electrical connections. The platter 108 can be connected to the cleaning chamber 104 so as to act as ground for the electrical connections to the acoustic-wave transducer 102 at springs 144.

In one embodiment, located above the platter 108 and the wafer 106, may be positioned a nozzle 151. Through the nozzle 151 can pass a second set of chemicals 126, 124, 125, and 127 ("second chemicals") during processing. The nozzle 151 can direct a fluid flow 150 onto the wafer device side 116 with each of the chemicals 126, 124, 125, and 127 in the cleaning process. The nozzle 151 can apply the chemicals 126, 124, 125, and 127 to the wafer 106 while the wafer 106 is not moving or while the wafer 106 is spinning. The nozzle 151 can apply the chemicals 126, 124, 125, and 127 at a flow rate to maintain a coating of the chemicals 126, 124, 125, and 127 on the wafer device side 116 surface with minimal excess.

The nozzle 151 can apply a continuous chemical flow to maintain a film thickness on the wafer 106 of at least 100 microns. To keep the chemical film at the 100 microns thickness, the chemicals 126, 124, 125, and 127 may be converted at the nozzle 151 into a mist having a particular mean diameter droplet size. All nozzle designs are limited as to how small a droplet size they can create. To meet the requirements of minimal fluid usage, a further reduction in droplet size may be required. One method of reducing the droplet size beyond a theoretical limit is to entrain, or dissolve, a gas, such as $H_2$ gas 105 or any other gas from the group of $O_2$, $N_2$, Ar, or He into the chemicals 126, 124, 125, and 127.

Referring still to FIG. 1A, the bracket 148 and the wafer 106 are rotated while the first chemicals 112 is applied from below to be in simultaneous contact with the platter 108 and the non-device side of the wafer 114. The second chemicals 126, 124, 125, and 127 are wetted out onto the device side 116 of the wafer 106. The acoustic-wave transducer 102 generates megasonic waves through the platter 108 into the first chemicals 112, captured by the wafer 106 and the platter 108. The megasonic waves may be incident to the wafer non-device side 114 at an angle substantially normal (perpendicular) to the wafer surface 114. A percentage of the megasonic waves, depending on the frequency or frequencies used, can pass through the wafer 106 to exit the wafer device side 116 and enter the second chemicals 126, 124, 125, and 127 that may be deposited as a film on the wafer device side 116. The megasonic waves acting within the second chemicals 126, 124, 125, and 127 can produce cleaning on the wafer device side 116. For optimal throughput speed, the total area of the acoustic-wave transducer 102 can be sufficient to provide approximately between 80–100% area coverage of the platter surface 119. The platter 108 diameter may be approximately the same size or larger than the wafer 106 diameter. The cleaning device 100 is scalable to operate on a wafer 106 that is 100 mm (diameter), 300 mm (diameter), or larger in size. If the wafer diameter is larger than the platter diameter, the vibrations from the megasonic energy striking the wafer 106 can still travel to the wafer 106 outer diameter (OD) providing full coverage for the cleaning action.

During the cleaning, rinse and dry cycles, the wafer 106 is rotated at a selected revolution per minute (rpm) about an axis 145 that runs through the bracket 148. Additionally, to optimize any particular cycle, the wafer spin rate may be stopped or varied and the sonic energy varied by changing any combination of the power setting, the frequency or frequencies, and by pulsing. Therefore, when the bracket 148 is in operation, the wafer 106 is seeing the first chemicals 112 on the non-device side 114, the second chemicals 126, 124, 125, 127 on the device side 116, while the wafer 106 is being rotated and radiated with megasonic energy.

Acoustic waves can first strike the wafer non-device side 114 where no devices 121 exist that could be damaged by the full force of the acoustic energy. Depending on the frequency or frequencies used, the megasonic energy may be dampened to a degree when passing through the platter 108 and wafer 106 to exit into the cleaning or rinse chemicals 126, 124, 125, and 127 at the wafer device side 116. As a result, the megasonic energy striking the wafer non-device side 114 may be powerful enough that only de-ionized (DI) water is used as the first chemicals 112.

A thin film (not shown) of the second chemicals 126, 124, 125, and 127 may be applied to wet the wafer device side 116 surface. If not DI water 125, the second chemicals 124, 126 and 127 may be a stronger chemistry such as used in an RCA (Radio Corporation of America) cleaning process. The action of the megasonic energy on the device structures 121 is confined to a small volume (thin film) that contacts the device structures 121, absorbs the sonic waves, and maintains useful cavitation.

In an embodiment, megasonic energy is applied to the rotating wafer 106 throughout the cleaning process. The megasonic energy is in a frequency range of 400 kHz–8 Mz but may be higher.

A drain 162 may be provided within the cleaning chamber housing 160 to collect the cleaning fluids. A cleaning chamber floor 163 may be angled toward the drain 162 to improve flow of the chemicals 112, 126, 124, 125, and 127 to the drain 162.

A matching circuit 170 connects the lead wires 146 to an RF power source 174, via a transmission line 176. In one embodiment, a transducer, or plurality of transducers, may be used with the megasonic cleaning device 100 that functions at only one frequency. Consequently, only one matching circuit 170 may be necessary. On the other hand, if more than one type of transducer is utilized, additional matching circuits and power sources may be necessary. The RF power source 174 delivers AC power signals to the transducer 102. The transducer 102, in combination with other surrounding elements, has a load impedance magnitude and phase. The RF power source has a source impedance magnitude and phase. The matching circuit matches the load impedance magnitude and phase of the transducer assembly to the source impedance magnitude and phase.

Figure 1B:
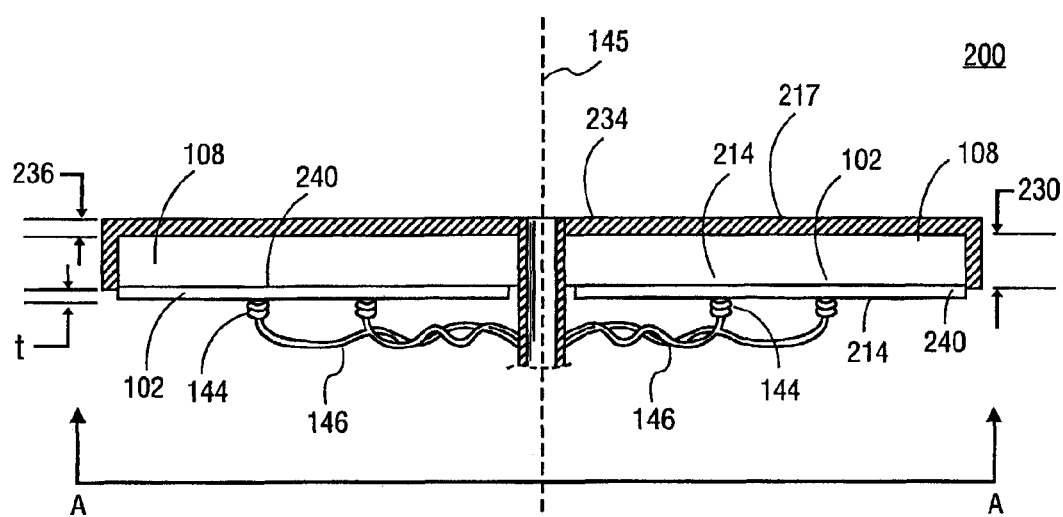

FIG. 1B is an illustration of a cross-section of one embodiment of an acoustic-wave transducer assembly 200 utilized in conjunction with megasonic cleaning device 100. The acoustic-wave transducer assembly 200 includes at least one transducer 102, connected to the platter 108. The platter 108 can be made of aluminum that is polished and may have an approximate diameter of 300 mm. Alternatively, it should be noted that the platter 108 could be made from a variety of materials such as sapphire, stainless steel, tantalum, or titanium. The platter 108 is approximately 3.43 mm thick (230) and the platter from side 217 can be coated with a protective fluoropolymer 234 such as Halar® (Ausimont USA, Thorofare, N.J.), having a coating thickness (236) of between 0.015–0.045". The platter backside 214 can have one or more acoustic-wave transducers 102 bonded directly to the aluminum platter with an electrically conductive epoxy adhesive or a solder having an adhesive/solder thickness 240 of approximately 0.001–0.010". The opposite side of each of the one or more acoustic-wave transducers 102 can be flexibly attached by springs 144 to electrical wiring 146 to provide power at a frequency while the platter 108 can be connected to ground. One ordinarily skilled in the art will recognize that transducer design is varied and that the transducer may be any other type known in the art.

Transducer thickness t can be sized to generate sound at a particular frequency. When a signal, generated at the frequency for which the transducer has been designed to respond, arrives at the transducer, the transducer will vibrate at that frequency. For example, a typical acoustic-wave transducer is made form a piezoelectric material having a thickness of 0.098", which is designed to respond to a frequency of 920 kHz. The piezoelectric material may be one of many well-known materials such as lead zirconate titanate (PZT), barium titanate or polyvinylidene fluoride resine (PVDF).

As previously explained, the effectiveness of cleaning by sound, in particular removing particles, can be related to frequency, and different sized particles can be more effectively removed with different megasonic frequencies. Currently, a large percentage of the particles to be removed from a wafer exist in the 0.3 $\mu$m (micron) and 0.1 $\mu$m sizes. It has been determined that in cleaning wafers, the megasonic removal of particles in the 0.3 $\mu$m size range is efficient in the 925 kHz range, while the megasonic removal of particles in the 0.1 $\mu$m range is efficient in the 1.8 MHz range.

For a 300 mm wafer 106, the frequency of 5.4 MHz has a special utility in that the 300 mm wafer 106 is transparent for those sound waves. At 5.4 MHz±30%, the sound waves can travel substantially through the wafer 106 to exit the opposite wafer surface. To obtain a frequency of 5.4 MHz, the thickness of the acoustic-wave transducer 102, as well as each thickness of all the other layers (platter 108 and adhesive/solder 240, FIG. 1B), are multiplied by a factor 920/5400=0.17 or alternatively the layer thicknesses of the acoustic-wave transducer piezoelectric material, adhesive, and aluminum platter are to be divided by a factor of 5.87. This will provide for a transducer to respond to a frequency of 5.4 MHz and for a reduced bounce back from the other layers of materials 108 and 240 that the sound must pass through on its way to the wafer 106.

The use of two frequencies has been given in the above embodiments for purposes of example, however, it should be appreciated that any number of different frequencies could be provided and that the percent of coverage from each transducer type producing each of the frequencies could be varied.

Figure 1C:
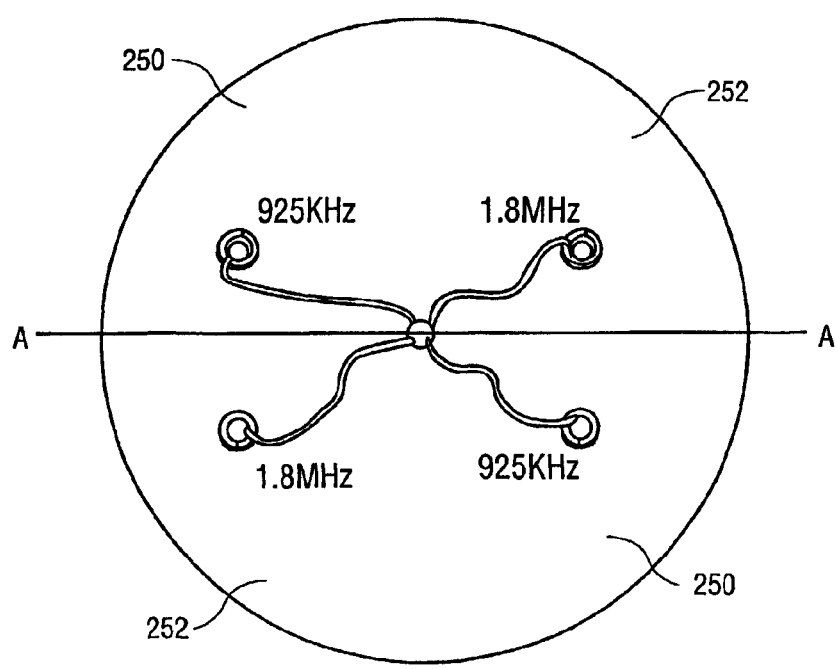

Thus, frequency range is important to effective particle removal on a wafer. Consequently, a variety of transducers of different sizes and shapes can be attached to the platter 108, each responding to different resonance frequencies. FIG. 1C illustrates just one configuration of a variety of possible transducer placement arrangements to transfer multiple frequency acoustic energy to the wafer. FIG. 1C illustrates the platter 108 having two groups of transducer 250 and 252 in diagonal quadrants.

Figure 2:
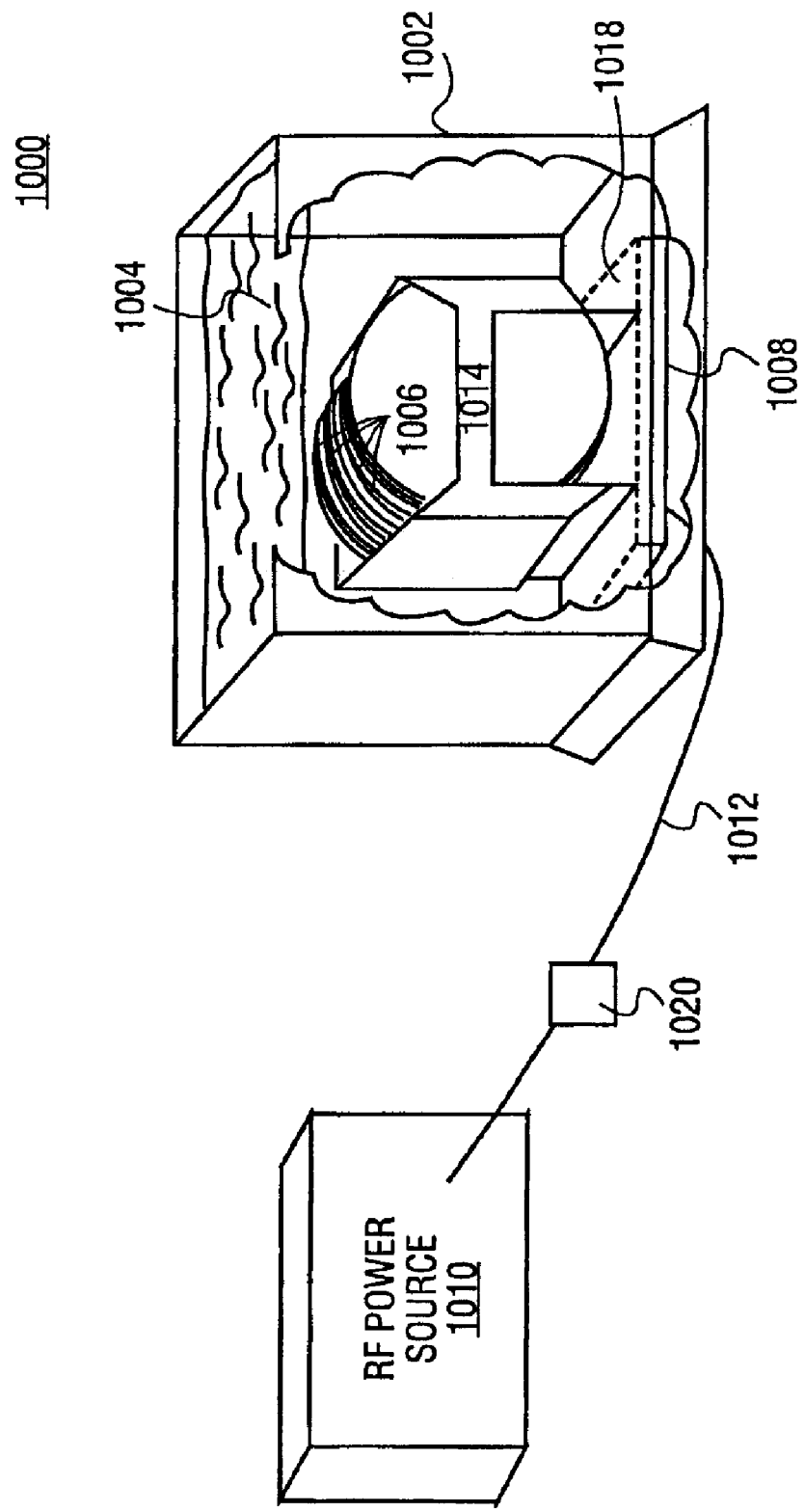
FIG. 2 is an exemplary megasonic cleaning device for cleaning multiple wafers.

The embodiments shown in FIGS. 1A–1C are configured to clean one wafer at a time. One ordinarily skilled in the art will recognize, however, that other well known types of megasonic cleaning devices exist that can clean multiple wafers at a time in a variety of different ways, and that may also be used in conjunction with any of the embodiments of the present invention. For example, FIG. 2 is an exemplary megasonic cleaning device 1000 for cleaning multiple wafers. It comprises a cleaning chamber 1002 filled with a liquid bath 1004. Multiple wafers 1006 are immersed in the bath liquid 1004. A transducer assembly 1008, including at least one megasonic acoustic-wave transducer, is connected to an RF power source 1010, to receive AC power signals through the transmission line 1012. The transducer assembly 1008 is in physical proximity to the cleaning chamber 1002 so that, once activated, the transducer assembly will transfer acoustic energy into the liquid bath 1004, causing cavitation to clean particles from the surfaces of the wafers 1006. A holder 1014 maintains the wafers 1006 in position within the cleaning chamber 1002. As shown in FIG. 2, the wafers 1006 are positioned so that the wafer surfaces 1016 are vertical (perpendicular to) to the side 1018 of the transducer assembly 1008 that faces towards the wafers 1006. However, one ordinarily skilled in the art will recognize that the wafers 1006 may be positioned so that the surfaces 1016 are horizontal (parallel to) to the face 1018 of the transducer assembly 1008, or at any other angle or position advantageous to wafer cleaning. Furthermore, the transducer assembly 1008 may be positioned at different angles, or on various sides, of the chamber 1002.

A matching circuit 1020 is connected between the transducer assembly 1008 and the RF power source. The transducer assembly 1008 has a load impedance magnitude and load impedance phase. The RF power source 1010 has a source impedance magnitude and source impedance phase. The matching circuit 1020 matches the load impedance magnitude and load impedance phase of the transducer assembly 1008 to the source impedance magnitude and source impedance phase of the RF power source 1010.

Figure 3:
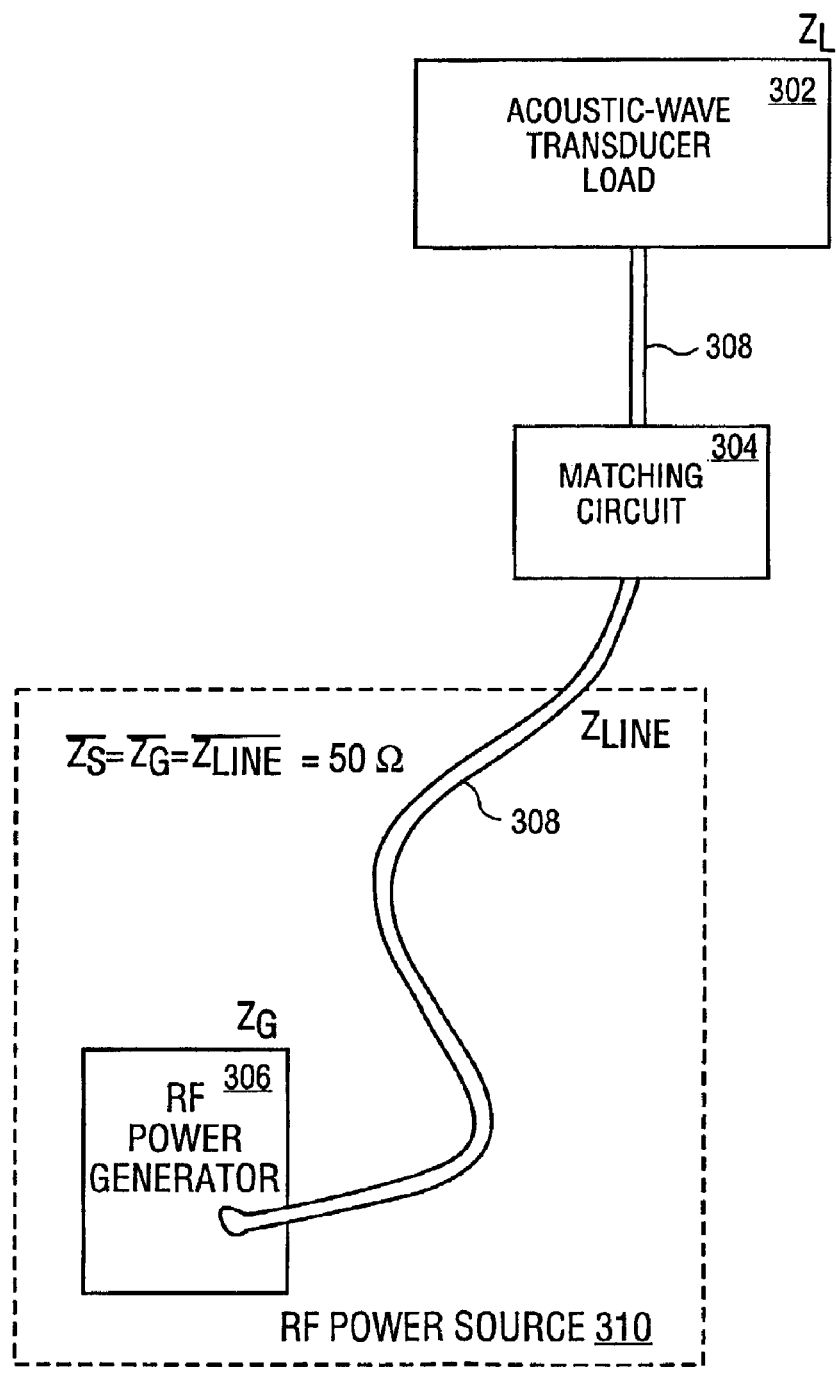
FIG. 3 is an illustration of a circuit connecting an acoustic-wave transducer load to an RF power source.

FIG. 3 is an illustration of circuit connecting an acoustic-wave transducer load 302 to an RF power source 310. The term "load" is utilized herein to discuss the delivery of electronic power from a power source to a circuit element, for example, any of the acoustic-wave transducers and/or transducer assemblies of FIGS. 1A–1C and FIG. 2. The acoustic-wave transducer load 302 is connected to a radio frequency ("RF") generator 306 via a transmission line 308. The RF power generator 306 is to deliver an AC power signal to the acoustic-wave transducer load 302 at a megasonic frequency. The RF generator 306 has an impedance $Z_G$. The transmission line 308 may also have an impedance $Z_{LINE}$. In one embodiment, the dimensions and constitution of the transmission line 308 are designed to match the impedance of the power generator 306 (i.e., $Z_G=Z_{LINE}$). In one embodiment, the transmission line is a 50 ohm coaxial cable and the power generator 306 has as impedance magnitude of 50 ohms. Herein, from an impedance viewpoint, the transmission line 308 and RF power generator 306 should always be considered matched, and, consequently, the term "RF power source", or "source", may be utilized in reference to the RF power generator 306 and the transmission line 308 collectively. The RF power source 310 impedance is characterized as $Z_S$ ("source impedance") and equals to 50 ohms impedance magnitude in one embodiment of the invention. Typically, RF power generators and transmission lines (e.g., coax cables) are designed with a fixed impedance magnitude of 50 ohms.

The acoustic-wave transducer load 302 has impedance, $Z_L$, which will herein be referred to as the "load impedance." The source impedance, $Z_S$, and load impedance, $Z_L$, are expressions representing the opposition that the RF power source 310 and acoustic-wave transducer load 302 give to the AC power signal as the signal travels through the transmission line 308. Acoustic-wave transducers are designed for a wide variety of applications utilizing megasonic frequencies and therefore the acoustic-wave transducer may vary in shape, size, materials, etc. Consequently, depending on the physical characteristics of the acoustic-wave transducer and the application for which the acoustic-wave transducer is used, the load impedance $Z_L$ may vary. An advantage of the matching circuit 304, however, described in further detail in conjunction with exemplary matching circuit 400 in FIG. 4 below, is that regardless of the actual acoustic-wave transducer used, the matching circuit 304 can be adjusted to suit the particular situation.

In the presence of an AC power signal, two parts characterize the source and load impedances: impedance magnitude and impedance phase. Impedance magnitude is the result of resistive opposition that the AC power signal encounters as the signal courses through the atoms of the load 302, generator 306, line 308, and matching circuit 304. The impedance phase, on the other hand, is not a physical opposition caused by physical resistance. Rather impedance phase is the result of the storage and release of energy in the load 302, generator 306, line 308, and matching circuit 304, as sinusoidal current and voltage waveforms course through them. However, because of the sinusoidal nature of the current and voltage waveforms, inductance and/or capacitance of the load 302, generator 306, line 308, or matching circuit 304, will cause the sinusoidal current and voltage waveforms to be out of phase with each other.

Both impedance magnitude and impedance phase can contribute to non-optimal power transfer of the power signals between the load 302 and the source 310. When the impedance magnitude of the load 302 and source 310 are different, or when the current and voltage waveforms are out of phase, then power transfer between source 310 and load 302 is non-optimal.

For this reason, the matching circuit 304 is introduced between the source 310 and the load 302. The matching circuit 304 is to match the source and load impedance magnitudes for a power signal transmitted from the RF power source 310 at a given megasonic frequency. Furthermore, the matching circuit 304 is to match the source and load impedance phases by adjusting the current and voltage waveforms to the same phase, so that impedance phase and impedance magnitude are matched at the same megasonic frequency.

Figure 4:
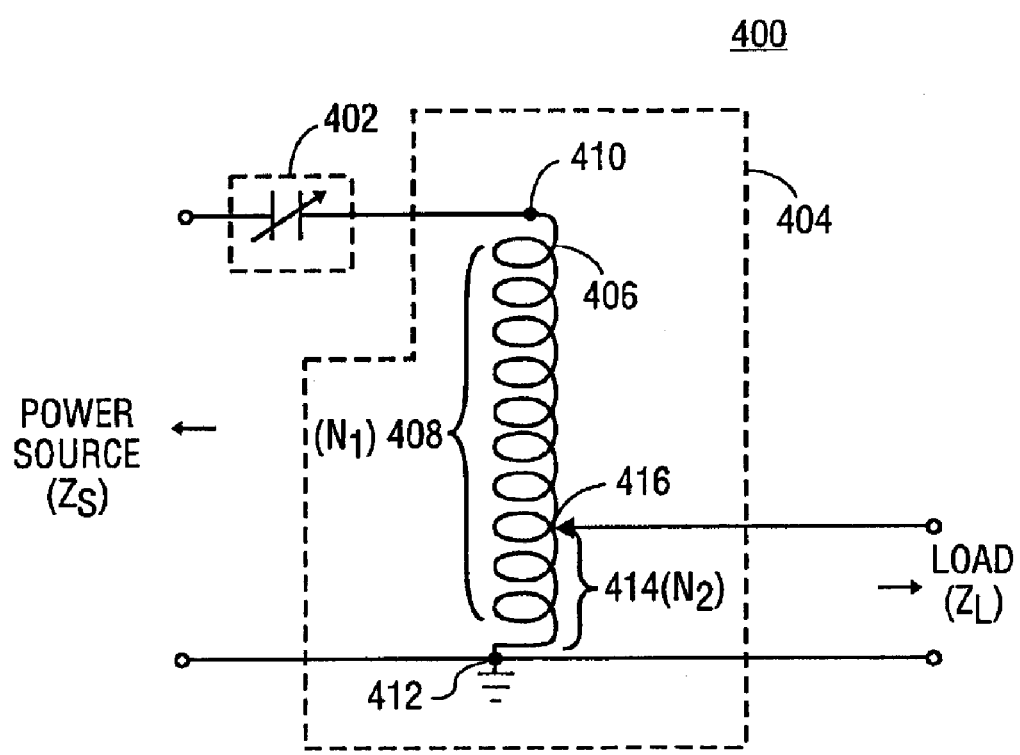
FIG. 4 illustrates one embodiment of a matching circuit according to the present invention.

FIG. 4 illustrates an exemplary matching circuit 400 according to the present invention. Referring to FIG. 4, the matching circuit 400 includes an impedance-phase-adjusting capacitor 402, which may also be referred to as an "impedance-phase-matching capacitor", a "phase-matching capacitor" or any other term indicating an ability to match impedance phase with a capacitor. The impedance-phase-adjusting capacitor is connected in series with an impedance-magnitude-adjusting transformer 404, which may also be referred to as an "impedance-magnitude-matching transformer", an "impedance transformer", or any other term indicating an ability to match impedance magnitude with a transformer. The impedance-magnitude-adjusting transformer 404 is to match the load impedance magnitude to the source impedance magnitude, and the impedance-phase-adjusting capacitor 402 is to match the load impedance phase to the source impedance phase.

As shown in FIG. 4, the impedance-magnitude-adjusting transformer 404 may be an autotransformer 404, which varies from a more common type of transformer known as a power transformer in that a power transformer has two distinct primary and secondary windings. An autotransformer, on the other hand, has a single coil that is "tapped" to produce what is electrically a primary and secondary winding. One ordinarily skilled in the art will recognize, however, that other kinds of transformers, or other electronic devices, may be utilized to provide impedance magnitude matching. Referring to FIG. 4, the coil 406 has a primary winding portion 408 between a top node 410 and bottom node 412. The bottom node may be connected to ground. The coil 406 also has a secondary winding portion 414 between a tap node 416 and the bottom node 412. In one embodiment of the invention, the top node 410 and bottom node 412 are connected to the RF power source, while the tap node 416 and the bottom node 412 are connected to the acoustic-wave transducer load. The primary winding portion 408 between the top node 410 and the bottom node 412 contains a first number of windings ($N_1$) to provide a primary electrical winding, or primary winding. The secondary winding portion 414 between the tap node 416 and the bottom node 412 contains a second number of windings ($N_2$), less than the first number of windings ($N_1$), to provide a secondary electrical winding, or secondary winding. The comparison of the secondary winding to the primary winding is the turns ratio ($n=N_1/N_2$). By adjusting the turns ratio, the impedance magnitude of the power source and the load can be matched.

Depending on the application for which the matching circuit 400 is used, the turns ratio for the autotransformer 404 can be adjusted. Impedance magnitude matching can be determined depending on the particular application for which the matching circuit 400 is used. Most often the impedance magnitude of the load will be predetermined since the application for which the acoustic-wave transducer will be known and the acoustic-wave transducer will not generally vary. Consequently, in one embodiment of the invention, the turns ratio can also be predetermined before operation of the circuit is commenced and the tap node 416, and hence the turns ratio, may be fixed, hardwired, etc., to a particular position for any given matching circuit used for a particular application. However, in other embodiments of the invention, where the impedance of the load is varied (e.g., if the transducer varies), then it may be advantageous to keep the tap node 416 unfixed so that it may adjusted during application set-up or during operation.

In one embodiment of the invention, as shown in FIG. 4, the impedance-phase-adjusting capacitor 402 is a variable capacitor 402 connected in series with the autotransformer 404 at the primary winding 408. One ordinarily skilled in the art, however, will recognize that other types of capacitors, other than variable capacitors, may be used. The value of the variable capacitor 402 can be adjusted to increase capacitance, which counteracts inductance introduced by the autotransformer 404, the RF power source, and the acoustic-wave transducer load. The higher the value the variable capacitor is tuned to, the more inductance it can counteract until the phase-difference of current and voltage waveforms, is zero, or as close to zero as possible. If not for the variable capacitor 402, the inductance would overwhelm the circuit and cause undesirable phase-differences in the power signals voltage and current.

The variable capacitor 402 is useful to adjust phase-differences for processes and assemblies having a variety of different load impedances and/or frequencies. As described above, acoustic-wave transducers are designed for a wide variety of applications utilizing megasonic frequencies and therefore the acoustic-wave transducer may vary in shape, size, materials, etc. Consequently, depending on the physical characteristics of the acoustic-wave transducer and the application for which the acoustic-wave transducer is used, the load impedance may vary. An advantage of the matching circuit 400 is that regardless of the actual acoustic-wave transducer used, the matching circuit 400 can be adjusted by varying the variable capacitor 402 to suit the particular situation.

For example, a first transducer may be swapped out of a megasonic cleaning device and replaced with a second transducer. The impedance phase of the second transducer may vary from that of the first transducer. It would therefore be advantageous to not have the variable capacitor 402 fixed so that the matching circuit 400 would not need to be swapped, rather merely adjusted for new phase matching. In another example, a transducer may simply experience wear and tear, causing physical characteristics of the transducer to change, in effect causing the impedance phase to also change. As a result, it may be advantageous to adjust the variable capacitor 402 to compensate. Furthermore, it may even be advantageous to adjust the variable capacitor 402 during operation of the transducer to optimize the cleaning process as it occurs.

In many cases, however, the transducer is predetermined and the load will not change. As a result, one setting on the variable capacitor 402 may be sufficient. Consequently, in one embodiment of the invention, the variable capacitor 402 may be fixed, hardwired, etc., before operation of the transducer load, or the variable capacitor 402 may instead be a non-variable capacitor designed to a particular value necessary to provide phase matching.

Furthermore, in the embodiment shown in FIG. 4, the variable capacitor 402 is shown connected in series between the autotransformer 404 and the RF power source. However, one ordinarily skilled in the art will recognize that the variable capacitor 402 could also be connected in series between the autotransformer 404 and the load.

Figure 5:
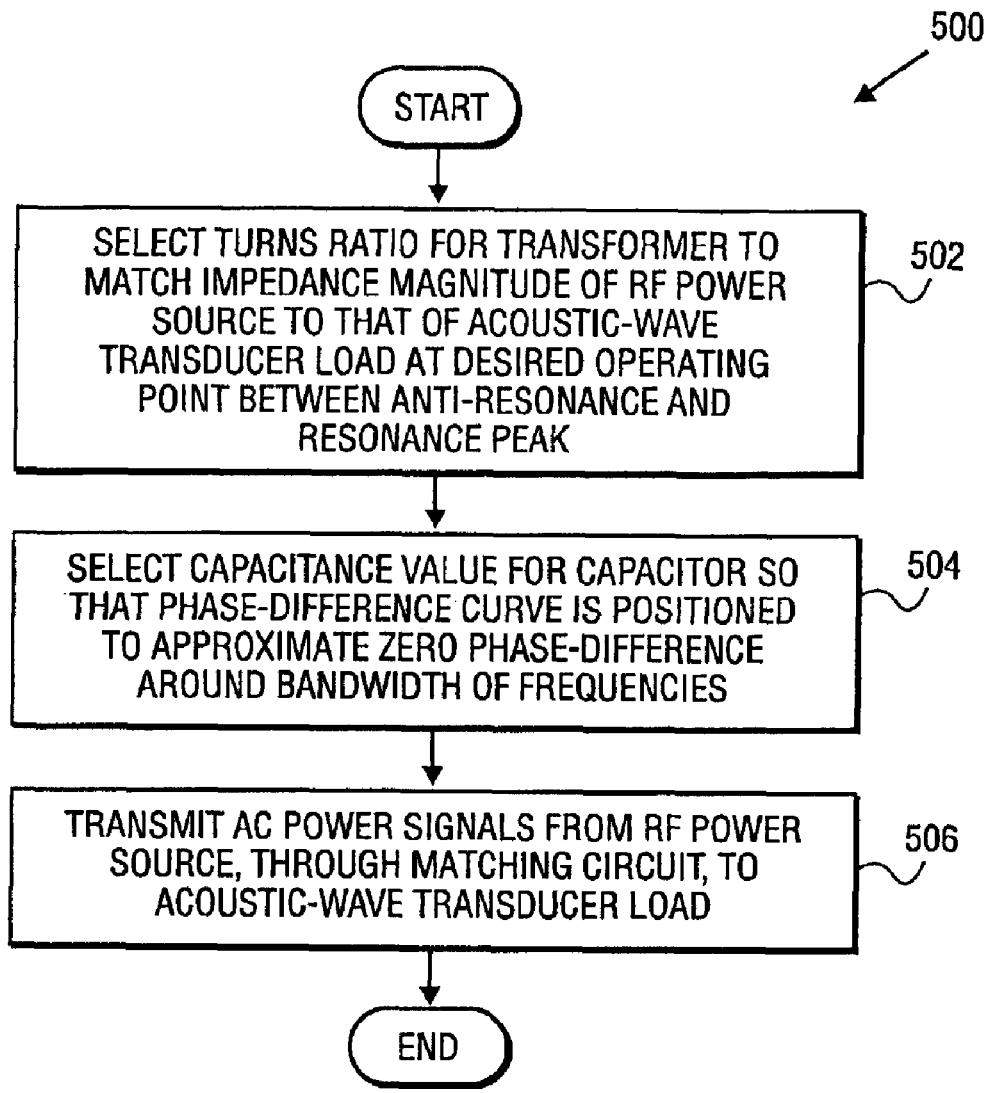
FIG. 5 is a flow diagram of one embodiment of a method for matching both impedance magnitude and impedance phase for a megasonic acoustic-wave transducer load.

FIG. 5 is a flow diagram of one embodiment of a method 500 for matching both impedance magnitude and impedance phase for a megasonic acoustic-wave transducer load. The acoustic-wave transducer load has an associated impedance resonance curve and an associated phase-difference curve. The acoustic-wave transducer load is connected to an RF power source via a matching circuit that includes an impedance-magnitude-adjusting transformer and an impedance-phase-adjusting capacitor. The method includes, as shown in processing block 502, selecting a turns ratio for the impedance-magnitude-adjusting transformer, such as an autotransformer, to match the impedance of the RF power source to that of the acoustic-wave transducer load at a desired operating point between an anti-resonance peak and a resonance peak of the transducer's impedance resonance curve. This may include adjusting the turns ratio to produce a peak in the resonance curve with an impedance magnitude greater than the impedance magnitude of the power source. Method 500 further includes, as shown at processing block 504, selecting a capacitance value of the impedance-phase-adjusting capacitor, such as a variable capacitor, so that a phase-difference curve is positioned to approximate zero phase-difference around a bandwidth of frequencies near the desired operating point. Finally, method 500 may conclude, as shown at processing block 506, with transmitting AC power signals at approximately the operating point frequency from the RF power source, through the matching circuit, to the acoustic-wave transducer load. Method 500 will be described in more detail in conjunction with FIGS. 6-9 below.

Figure 6:
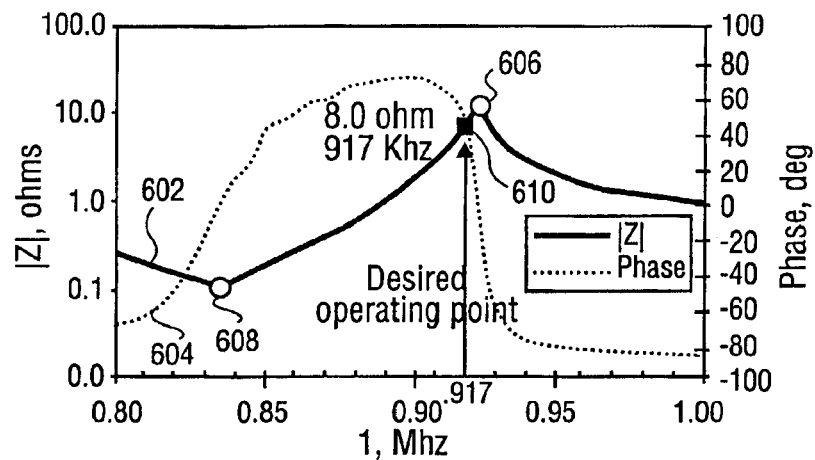
FIG. 6 is an illustration of a resonance curve and phase-difference curve for an acoustic-wave transducer load over a range of operating frequencies before applying the method described in FIG. 5.

FIG. 6 is an illustration of a resonance curve 602 and a phase-difference curve 604 for an acoustic-wave transducer load over a range of operating frequencies (e.g., 875 kHz–975 kHz), before applying the method 500. The acoustic-wave transducer load may include a transducer designed to operate at a particular resonance frequency, such as 925 kHz. As such, the transducer's resonance curve may demonstrate an anti-resonance peak 606 at 925 kHz. However, the transducer may be operated at any point along the resonance curve, for example, at the desired operating point 610 corresponding to the frequency of 917 kHz. Theoretical and experimental simulations have shown that maximum transducer efficiency, measured in terms of acoustic pressure, is somewhere in the middle of the resonance curve between resonance 608 and anti-resonance 606. However, the value of $|Z|$ in the middle of the resonance curve is small, only about 4–5 ohms. If the desired point were chosen to be near the middle of the resonance curve a matching circuit would require a transformer with a turns ratio so high that it would cause enormous losses due to heating caused by very high current flow through the secondary winding. For this reason, the desired operating point is chosen to be in a range slightly above the middle of the resonance curve, but slightly below the anti-resonance peak 606. In the embodiment shown in FIG. 6, this range is anywhere within 5–8 ohms, and the exact desired operating point is at 8 ohms. At that point, the corresponding frequency of the desired operating point is 917 kHz. In the following embodiments, therefore, the term "desired operating point" will be utilized to indicate the point on the resonance curve corresponding to the frequency of 917 kHz.

In one embodiment, the acoustic-wave transducer load may be used in conjunction with an RF power source, including a 50 ohm RF power generator and 50 ohm matched transmission line. The impedance magnitude difference between the load (8 ohms) and the source (50 ohms) would be 42 ohms—an enormous impedance magnitude difference. In addition, at the desired operating point, the phase curve shows a phase-difference of almost 40 degrees (408). The circuit would encounter tremendous power loss. Both impedance magnitude matching and impedance phase matching are needed.

Figure 7:
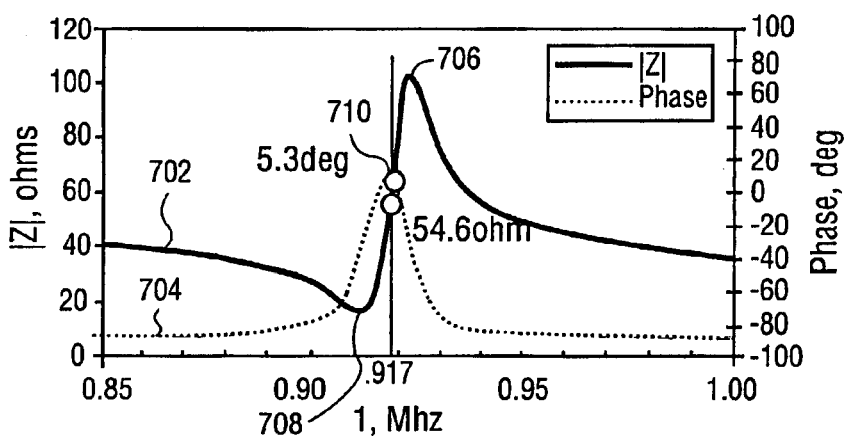
FIG. 7 is an illustration of a resonance curve and a phase-difference curve for an acoustic-wave transducer load over a range of operating frequencies after applying the method described in FIG. 5.

FIG. 7 is an illustration of a resonance curve 702 and a phase-difference curve 704 for an acoustic-wave transducer load over a range of operating frequencies, after applying the method 500. A matching circuit is applied comprising an impedance-magnitude adjusting transformer and an impedance-phase-adjusting capacitor. A turns ratio is selected for the transformer (as described in FIG. 5, processing block 502) so that the impedance resonance curve of the acoustic-wave transducer circuit produces a steep, nearly vertical, slope at approximately the impedance of the RF power source (i.e., 50 ohms). This may require selecting the turns ratio so that a maximum peak, or anti-resonance peak 706, in the resonance curve is greater than the impedance of the power source. In the embodiment shown in FIG. 7, the turns ratio is selected to produce a maximum peak approximately twice the impedance of the power source, approximately 100 ohms. The anti-resonance peak 706 should be high so that the slope of the resonance curve is steep near the frequencies where the impedance magnitude of the RF power source matches that of the acoustic-wave transducer load (i.e., around 50 ohms). At the same time, the minimum peak, or resonance peak 708, should be well below where the impedance magnitude of the RF power source matches that of the acoustic-wave transducer load. The middle of the curve therefore approximates the impedance of the RF power source around a range of frequencies. This frequency range may be termed a "bandwidth". The bandwidth exists between the resonance peak 708 and the anti-resonance peak 706, approximately where the impedance magnitude of the RF power source matches that of the acoustic-wave transducer load (i.e., around 50 ohms). Depending on the transducer manufacturer, and the temperature and constitution of the cleaning liquid, the bandwidth may be produced to within a 4–5 kHz range in width, centered on the desired operating point. The desired operating frequency still corresponds to 917 kHz, and the desired operating point would be the point on the resonance curve corresponding to 917 kHz. In the embodiment shown in FIG. 7, that on the resonance curve corresponds to an impedance magnitude of 54.6 ohms. Those ordinarily skilled in the art, however, will recognize that the transformer's turns ratio can be adjusted to work at other desired operating points.

In practice, the turns ratio of the impedance-magnitude-adjusting transformer may be selected before the actual operation of the transducer if the load impedance of the transducer is known. For example, the methodologies described herein may be utilized during simulation, set-up, or calibration of a megasonic cleaning device. The operating point, therefore, is predetermined based on the kind of megasonic operation that will be performed and the type of transducer used during that operation. Consequently, the turns ratio may be selected and then fixed for future operation. Fixing the turns ratio depends on when the method is performed. For example, during a simulation, the impedance-magnitude-adjusting transformer would be only a software object in the simulation program and the turns ratio value would be variable in a computer program. During setup of the cleaning device, however, selecting the turns ratio may be done manually and therefore may include moving the tap node for an autotransformer. The tap node can be fixed by soldering it into the appropriate position corresponding to the selected turns ratio. The turns ratio may be adjusted during, or between, operations if the transducer load changes significantly (e.g., by swapping out different sized transducers) and therefore it may include unsoldering the tap node and moving it to a different position.

The capacitance value of the impedance-phase-adjusting capacitor is selected (as described in FIG. 5, processing block 504) to a value (e.g., 3 nanofarads to 5 nanofarads), so that the phase curve approximates zero phase-difference around the bandwidth of frequencies. In one embodiment of the invention, this is accomplished by positioning a peak 710, or a point near the peak, of the phase-difference curve slightly above 0° phase-difference (e.g., around 58 phase-difference to 10° phase-difference) at the same frequency that the resonance curve approximately matches the impedance of the transmission line. In FIG. 7, the phase peak was placed at approximately 58 phase-difference, shown as 5.38 phase-difference in FIG. 7, at a frequency approximating the desired operating point and within the bandwidth. During operation of the transducer, the operating frequency may tend to shift away from the desired operating point. Since the shape of the phase curve angles downward toward 0 8 phase-difference, and slopes gradually from about 58 phase-difference to about −58 phase-difference over the bandwidth (e.g., approximately 917 kHz 6 2.5 kHz), then the transducer experiences only about 658 phase-difference over the bandwidth and is able to function at near-optimal power transfer between source and load.

In practice, the load impedance magnitude and phases can be predetermined, hence the capacitance value of the impedance-phase-adjusting capacitor may be selected- previous to the actual operation of the megasonic cleaning device, for example during simulation or actual set-ups and calibration of a megasonic cleaning device. The capacitance value of the impedance-phase-adjusting capacitor may be selected to provide the necessary capacitance necessary to position the phase curve, and then the capacitance value may be held fixed (e.g., hardwired) for the actual operation of the megasonic cleaning device. The benefit of the bandwidth is obvious when considering that for a fixed capacitance value, actual operation of the megasonic cleaning device can operate at near optimal power efficiency over the bandwidth of frequencies.

For example, in the process of cleaning silicon wafers (i.e., during operation), the acoustic-wave transducer may agitate liquid inside a cleaning chamber; however, the liquid level may not remain steady during operation since waves in the liquid, produced by the transducer, may further introduce slight changes to the impedance of the transducer load. Nevertheless, as shown in the FIG. 7, even if the load impedance were to change slightly the resonance curve will still match to phase-differences very near to 0° phase-difference on the phase curve (within about ±5° phase difference).

In addition, after the capacitance value of the variable capacitor is selected, the bandwidth that the megasonic cleaning device experiences during operation allows the RF power source to slightly shift frequencies and still encounter near-optimal power transfer. For example, the frequency of the power source may need to adjust to conditions within the cleaning chamber of a megasonic cleaning device, such as to a shifting load impedance value or to the rotation of the wafer on the platter. As a consequence, if the frequency were to change slightly, then the phase-difference would still be very near to zero. Consequently, the matching circuit can provide near optimal power transfer within the bandwidth during the operation of the cleaning device, resulting in a more robust power-saving cleaning device.

As mentioned above, the capacitance value of the impedance-phase-adjusting capacitor could be selected before operation and held fixed during operation. It should be noted, however, that the impedance-phase-adjusting capacitor may be adjusted during operation, or between operations, of the megasonic cleaning device if, for whatever reason, the impedance load were to change (e.g., by swapping out different sized transducers) so that the operational efficiency was no longer possible over the bandwidth, or to change the phase curve to match a different desired operating frequency. In an embodiment where the impedance-phase-adjusting capacitor is a variable capacitor, then the capacitance value of the variable capacitor may be adjusted, when necessary, to shift the phase curve up or down, and therefore the bandwidth can be easily shifted simply by adjusting the variable capacitor to higher or lower capacitance values. As the capacitance value increases, the phase curve shifts upward. As the capacitance value decreases, the phase curve shifts downward.

Figure 8:
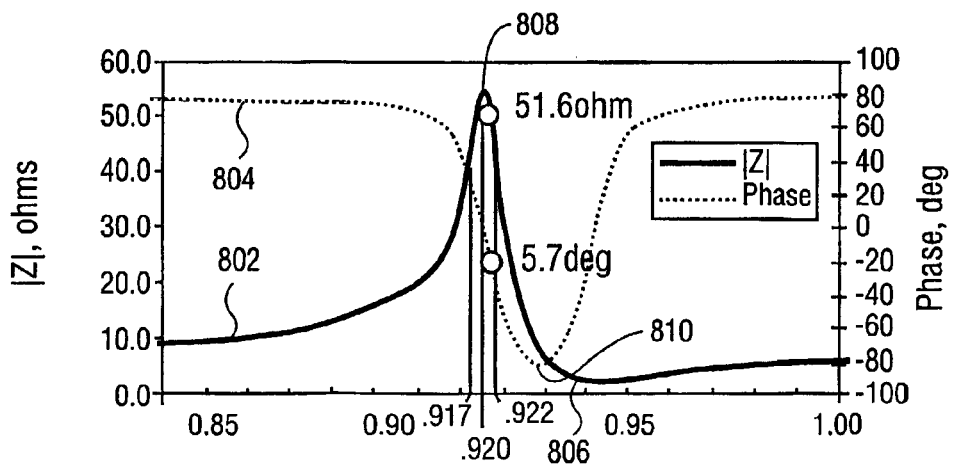
FIG. 8 shows a resonance curve and phase curve for an acoustic-wave transducer load if the phase-adjusting variable capacitor were not included in the matching circuit.

FIG. 8 is an illustration of a resonance curve 802 and phase curve 804 for an acoustic-wave transducer load if an impedance-phase-adjusting capacitor were not included in the matching circuit. Problems can be seen in the shapes of the resonance curve 802 and phase curve 804. For example, because of the large amounts of inductance introduced by the transformer and the transmission line, the resonance curve is flipped so that the anti-resonance peak 806 is at the bottom of the curve and the resonance peak 808 is at the top. Thus, the slope of the resonance curve between resonance 808 and anti-resonance 806 slopes away from the corresponding frequency of the desired operating point (i.e. 917 kHz). The transducer would experience an optimal operating point around 922 kHz, but it would be far from the desired operating point. On the other hand, embodiments of the matching circuit described herein introduce an impedance-phase-adjusting capacitor, which has sufficient capacitance to counteract the inductance of the transformer and the transmission line, thus returning the slope of the resonance curve to its original orientation, and allows the transducer to operate near the desired operating point.

Another problem readily apparent in FIG. 8 is that the large amount of inductance from the transformer inverts the shape of the phase curve 804 and shifts the peak 810 away from the desired operating point, thus resulting in a phase curve with a steep slope around the optimal frequency point, 922 kHz. Thus, if the frequency were to shift even slightly away from 922 kHz, a very large phase-difference would result. For example, if the frequency were to shift slightly, to about 920 kHz, the phase-difference would balloon from 5.78 phase-difference to about 408 phase-difference. If the frequency were to shift even a little more, for example to the frequency of the originally desired operating point, 917 kHz, the phase-difference would become almost 608. Without the variable capacitor, there is no way to correct the phase curve 804. Consequently, the phase could be grossly mismatched, thus resulting in significant power transfer loss. Thus, embodiments of the present invention are advantageous because they allow a means to adjust the phase curve 804, resulting in a transducer that can operate at several optimal points along the transducer resonance curve, between the anti-resonance point and resonance point.

Another problem with the method of matching using only a transformer, as shown in FIG. 8, is that the method tries to match the maximum resonance peak 808 to the exact RF power source impedance. To match impedance exactly, however, requires very complex adjustments to be made to the transformer, and allows for power transfer efficiency at only one optimal frequency point. On the other hand, via embodiments of the present invention, the process is made much easier, and more robust, by utilizing an impedance-phase-adjusting capacitor to adjust the phase peak to provide nearly zero phase-shift along several near-optimal frequency points that are between peaks. Plus, as stated further above, actual particle removal simulations indicate that operating the matching circuit on the slope between resonance and anti-resonance peaks, not at one of the peaks, leads to more optimal cleaning.

Figure 9:
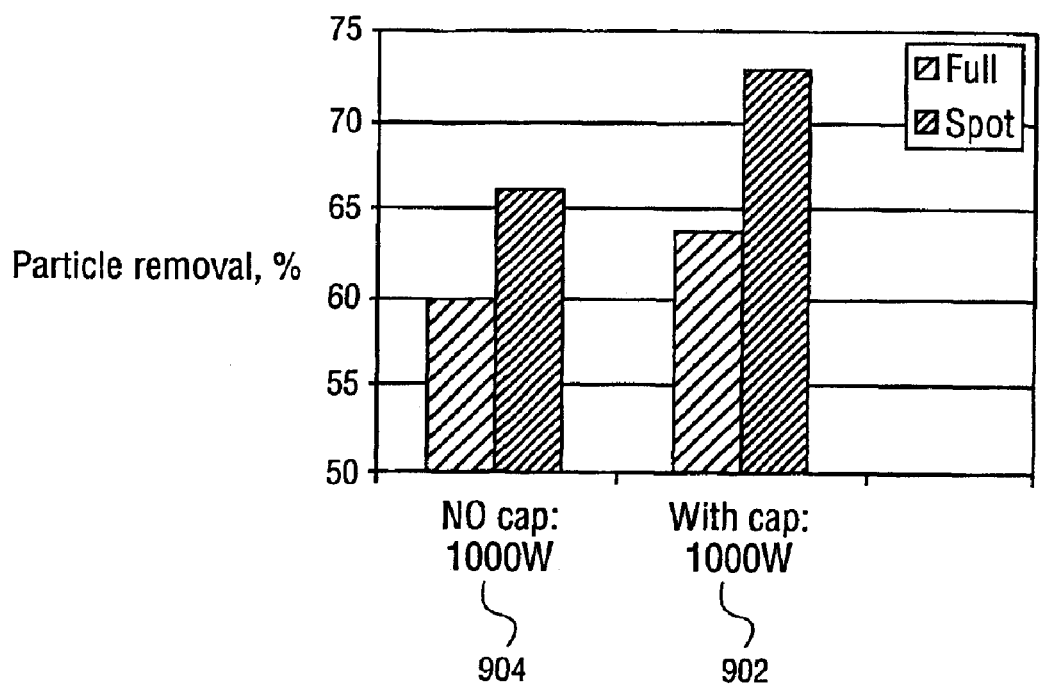
FIG. 9 is a bar graph diagram demonstrating the efficiency of particle removal from a 300 mm wafer, according to the present invention.

FIG. 9 is a bar graph diagram demonstrating the efficiency of particle removal from a 300 mm wafer, according to the present invention. Referring to FIG. 9, percentages are shown comparing full and spot particle removal between a megasonic wafer cleaner 902 utilizing a matching circuit with an impedance-phase-matching capacitor and a megasonic wafer cleaner 904 utilizing a matching circuit without an impedance-phase-matching capacitor. As shown in FIG. 9, for power transmissions of 1000W, the megasonic wafer cleaner utilizing a matching circuit with an impedance-magnitude-matching transformer and an impedance-phase-matching capacitor cleans a wafer significantly better than a megasonic wafer cleaner utilizing a matching circuit without an impedance-phase-matching capacitor. According to the graph, phase matching can improve efficiency up to 3% for full particle removal and up to 8% for spot removal of particles.

Several embodiments of the invention have thus been described. However, those ordinarily skilled in the art will recognize that the invention is not limited to the embodiments described, but can be practiced with modification and alteration within the spirit and scope of the appended claims that follow.

What is claimed:

1. A matching circuit, comprising:
   an autotransformer connected to an acoustic-wave transducer load and to an RF power source, the acoustic-wave transducer load having a load impedance magnitude and phase and the RF power source having a source impedance magnitude and phase, and the autotransformer to match the source and load impedance magnitudes for a signal transmitted at an operating frequency; and
   a variable capacitor connected to the autotransformer, the variable capacitor to match the source and load impedance phases.

2. The matching circuit of claim 1, wherein the variable capacitor is to provide capacitance to counteract inductance introduced by the autotransformer and a transmission line.

3. The matching circuit of claim 1, wherein the variable capacitor is connected in series between either the autotransformer and the RF power source or between the autotransformer and the acoustic-wave transducer load.

4. The matching circuit of claim 1, wherein the operating frequency is a megasonic frequency.

5. The matching circuit of claim 1, wherein the operating frequency is between approximately 875 to 975 kHz.

6. The matching circuit of claim 1, wherein the variable capacitor is to adjust a phase-difference curve to provide near-optimal power transfer within a bandwidth of approximately 5 kHz.

7. The matching circuit of claim 1, wherein the autotransformer has a coil with a first portion between a top node and a tap node, and a second portion between the tap node and a bottom node, the top and bottom nodes connected to the RF power source via a transmission line, and the tap and bottom nodes connected to the acoustic-wave transducer load via the transmission line, wherein the first portion of the coil provides a secondary winding and the second portion provides a primary winding.

8. A matching circuit, comprising:

an impedance-magnitude-adjusting transformer connected to an acoustic-wave transducer load and to an RF power source, the acoustic-wave transducer load having a load impedance magnitude and phase and the RF power source having a source impedance magnitude and phase, the impedance-magnitude-adjusting transformer to match the source and load impedance magnitudes for a signal transmitted at an operating frequency; and an impedance-phase-adjusting capacitor connected to the impedance-magnitude-adjusting transformer, the impedance-phase-adjusting capacitor to match the source and load impedance phases.

9. The matching circuit of claim 8, wherein the impedance-magnitude-adjusting transformer is an autotransformer.

10. The matching circuit of claim 8, wherein the impedance-phase-adjusting capacitor is a variable capacitor.

11. The matching circuit of claim 8, wherein the operating frequency is a megasonic frequency.

12. The matching circuit of claim 8, wherein the operating frequency is between approximately 875 to 975 kHz.

13. The matching circuit of claim 8, wherein the impedance-phase-adjusting capacitor is to adjust a phase-difference curve of the acoustic-wave transducer load to provide near-optimal power transfer within a bandwidth of approximately 5 kHz.

* * * * *